US007748594B2

(12) United States Patent
Yamamoto et al.

(10) Patent No.: US 7,748,594 B2
(45) Date of Patent: Jul. 6, 2010

(54) SOLDER REPAIRING APPARATUS AND METHOD OF REPAIRING SOLDER

(75) Inventors: Keiichi Yamamoto, Kawasaki (JP); Toru Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/216,997

(22) Filed: Jul. 14, 2008

(65) Prior Publication Data
US 2009/0045245 A1 Feb. 19, 2009

(30) Foreign Application Priority Data
Aug. 16, 2007 (JP) ............................. 2007-212278

(51) Int. Cl.
B23K 1/20 (2006.01)
B23K 31/02 (2006.01)
B23K 1/18 (2006.01)

(52) U.S. Cl. .......................... 228/13; 228/119; 228/264
(58) Field of Classification Search ................. 228/118, 228/119, 264, 13, 18, 20.1–23, 191
See application file for complete search history.

(56) References Cited

U.S. PATENT DOCUMENTS

| 4,351,468 | A | * | 9/1982 | Floury et al. ................. 228/4.5 |
| 4,768,698 | A | * | 9/1988 | Brown et al. .................. 228/18 |
| 4,817,849 | A | * | 4/1989 | Yamamoto et al. .......... 228/103 |
| 4,877,175 | A | * | 10/1989 | Jones et al. ................. 228/102 |
| 4,896,019 | A | * | 1/1990 | Hyun ........................ 219/228 |
| 4,918,277 | A | * | 4/1990 | Zimmer ...................... 219/56.1 |
| 4,979,290 | A | * | 12/1990 | Chiba ......................... 29/840 |
| 5,220,147 | A | * | 6/1993 | Spigarelli et al. ............ 219/85.1 |
| 5,229,575 | A | * | 7/1993 | Waller et al. ................. 219/233 |
| 5,241,156 | A | * | 8/1993 | Wallgren et al. ............. 219/233 |
| 5,423,931 | A | * | 6/1995 | Inoue et al. .................... 156/94 |
| 6,053,393 | A | * | 4/2000 | Burke et al. ................. 228/119 |
| 6,186,387 | B1 | * | 2/2001 | Lawrence et al. .......... 228/20.5 |
| 6,204,471 | B1 | * | 3/2001 | Kurihara ................. 219/121.62 |
| 6,333,491 | B1 | * | 12/2001 | Bergeron et al. ............ 219/388 |
| 6,539,618 | B1 | * | 4/2003 | Lyke ............................ 29/762 |
| 6,719,188 | B2 | * | 4/2004 | Farooq et al. ................ 228/264 |
| 7,342,749 | B2 | * | 3/2008 | Hashi et al. ............... 360/245.8 |
| 2007/0284042 | A1 | * | 12/2007 | Yamamoto .................. 156/344 |
| 2008/0099536 | A1 | * | 5/2008 | Yamamoto et al. .......... 228/191 |

FOREIGN PATENT DOCUMENTS

| JP | 4-320091 | 11/1992 |
| JP | 6-339769 | 12/1994 |
| JP | 7-132369 | 5/1995 |
| WO | WO 2007004259 A1 * | 1/2007 |

* cited by examiner

Primary Examiner—Kiley Stoner
Assistant Examiner—Carlos Gamino
(74) Attorney, Agent, or Firm—Staas & Halsey LLP

(57) ABSTRACT

A solder repairing apparatus includes a stage designed to place the surface of at least a specific part of an object along a reference plane within a specific spot defined on the stage. A heating unit applies a thermal energy to the specific spot. A dividing plate is designed to move into the specific spot in a vertical attitude perpendicular to the reference plane. The dividing plate exhibits a low solder wettability. The solder melts in response to the application of the thermal energy. When the dividing plate in the vertical attitude enters the specific spot, the dividing plate gets into the solder. Since the dividing plate exhibits a low solder wettability, the dividing plate repels the solder. The solder is divided into two parts. The division of the solder reliably eliminates a short circuit in the electronic circuit.

7 Claims, 9 Drawing Sheets

SOLDER REPAIRING APPARATUS AND METHOD OF REPAIRING SOLDER

BACKGROUND OF THE INVENTION

1. Field of the Invention

The present invention relates to a so-called solder repairing apparatus and a method of repairing solder.

2. Description of the Prior Art

Two or more electronic components are mounted on a printed wiring board in a printed circuit board unit. Solder is employed to mount the electronic components on the printed wiring board. The solder often happens to bridge two or more electrode pads on the printed wiring board. A short circuit is established in an electronic circuit on the printed wiring board. Such a printed circuit board unit cannot be shipped out of a factory.

It is required to eliminate such a short circuit in the electronic circuit of the printed circuit board unit. The corresponding electronic component is removed from the printed wiring board so as to eliminate the short circuit. A new electronic component is then mounted on the printed wiring board. Repair of the solder thus causes the replacement of the electronic components.

An operator is required to manipulate the electronic components with his/her own hands for detachment or attachment of the electronic component. The operator usually uses a soldering iron to heat the electronic component. The electronic component is removed during the application of heat to the electronic component. A highly advanced technique is required to use the soldering iron for detachment and attachment of the electronic component of a smaller size. The working efficiency gets worse. In addition, the removed electronic component is inevitably wasted. It is desirable to avoid the waste of the electronic component as much as possible.

SUMMARY OF THE INVENTION

It is accordingly an object of the present invention to provide a solder repairing apparatus and a method of repairing solder, enabling elimination of a short circuit in an electronic circuit in a relatively facilitated manner regardless of a reduction in the size of an electronic component.

According to a first aspect of the present invention, there is provided a solder repairing apparatus comprising: a stage designed to place the surface of at least a specific part of an object along a reference plane within a specific spot defined on the stage; a heating unit applying a thermal energy to the specific spot defined on the stage; and a dividing plate designed to move into the specific spot in a vertical attitude perpendicular to the reference plane, the dividing plate exhibiting a low solder wettability.

The solder repairing apparatus serves to locate solder at the specific spot on the stage. The solder melts in response to the application of the thermal energy. When the dividing plate in the vertical attitude enters the specific spot, the dividing plate gets into the solder. Since the dividing plate exhibits a low solder wettability, the dividing plate repels the solder. The solder is thus divided into two parts. The division of the solder reliably eliminates a short circuit in the electronic circuit.

The heating unit may include a radiation source radiating an energy beam. The energy beam causes no physical force. No force is thus applied to the mounted component while the solder melts. The mounted component is thus prevented from shifting from a predetermined mounting position. Hot air is utilized in a conventional heating process, for example. Hot air often causes the mounted component to accidentally shift from the predetermined mounting position.

The heating unit may include a mask placed between the radiation source and the specific spot, the mask defining a window opening so that the energy beam from the radiation source partly passes through the window opening. The mask allows formation of a beam spot having a specific contour on the object. The mask thus serves to limit the spot of the energy beam. The circumference outside the beam spot is reliably prevented from rise in the temperature.

The energy beam may be radiated to the specific spot in the vertical direction perpendicular to the reference plane. The radiation of the energy beam to the specific spot in the vertical direction enables a higher density of the thermal energy. The energy is utilized to heat the solder with high efficiency.

The solder repairing apparatus may further comprise a dividing plate supporting mechanism designed to support the dividing plate for relative rotation around the rotation axis perpendicular to the reference plane. The dividing plate is allowed to rotate around the rotation axis. The dividing plate is thus allowed to take an appropriate attitude around the rotation axis with respect to the object. The solder repairing apparatus may further comprise, in place of the dividing plate supporting mechanism, a stage supporting mechanism designed to support the stage for relative rotation around the rotation axis perpendicular to the reference plane.

The solder repairing apparatus may further comprise a controller circuit outputting a control signal for starting application of the thermal energy after the dividing plate has contacted against the specific part with a predetermined urging force. The melting of the solder is allowed to trigger the division of the solder with the dividing plate. It is unnecessary to provide means to uniquely detect the melting of the solder in a specific manner. The structure of the solder repairing apparatus can thus be simplified.

According to a second aspect of the present invention, there is provided a method of repairing solder, comprising: placing solder on a predetermined reference plane, the solder spreading over at least two electrode pads on a printed wiring board; applying a thermal energy to the solder so that the solder melts to provide a molten solder; and dividing the molten solder into two parts with a dividing plate set in a vertical attitude perpendicular to the reference plane. The division of the solder reliably eliminates a short circuit in the electronic circuit.

The method may employ a flux be applied to the surface of the dividing plate. The flux causes the activation of the solder when the solder melts. The activation of the molten solder enables division of the molten solder with the dividing plate in a facilitated manner.

The method may employ an energy beam radiated from a radiation source for the application of the thermal energy. The energy beam causes no physical force as described above. No force is thus applied to the mounted component while the solder melts. The mounted component is thus prevented from shifting from a predetermined mounting position.

The energy beam is preferably radiated to the solder in the vertical direction perpendicular to the reference plane. The radiation of the energy beam to the specific spot in the vertical direction enables a higher density of the thermal energy. The energy is utilized to heat the solder with high efficiency.

The dividing plate may be rotated around the rotation axis perpendicular to the reference plane. Alternatively, the stage may be rotated around the rotation axis perpendicular to the reference plane. In either case, the dividing plate is allowed to take an appropriate attitude around the rotation axis with respect to the object.

The method may further comprise separating the dividing plate from the solder having been hardened after being divided. The method reliably prevents recombination of the divided pieces of the molten solder.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
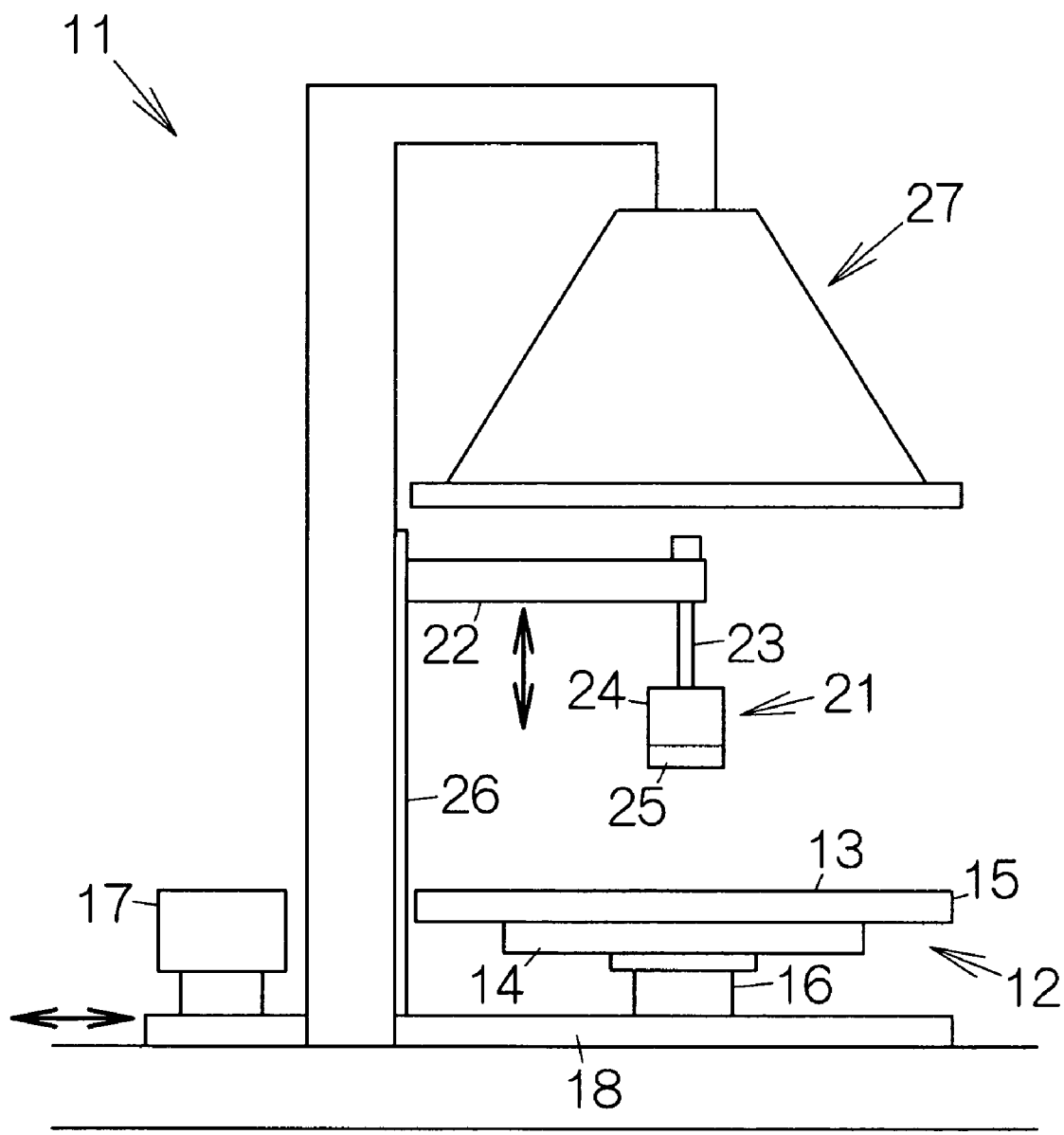
FIG. 1 is a front view schematically illustrating a solder repairing apparatus according to an embodiment of the present invention.

As shown in FIG. 1, a solder repairing apparatus includes a movable stage 12. The movable stage 12 defines a support surface 13 extending along a horizontal plane, namely a reference plane. The support surface 13 is allowed to move along the x-axis and the y-axis, perpendicular to each other within a horizontal plane. An X-axis stage 14 and a Y-axis stage 15 are incorporated in the movable stage 12 so as to realize the movement of the support surface 13. The X-axis stage 14 is driven to move in the direction of the x-axis within the horizontal plane. The Y-axis stage 15 is driven to move in the direction of the y-axis within the horizontal plane. A ball screw mechanism or a linear motor mechanism may be employed to realize the movement in the directions of the x-axis and the y-axis.

The solder repairing apparatus 11 includes a stage supporting mechanism 16. The stage supporting mechanism 16 is designed to support the movable stage 12 for relative rotation around a vertical axis, namely the z-axis. The support surface 13 on the movable stage 12 is thus allowed to rotate around the vertical axis. A driving source such as a stepping motor is incorporated in the stage supporting mechanism 16 so as to realize the rotation, for example. The driving force of the driving source is converted into the rotation of the movable stage 12 through a gear mechanism, for example.

A flux bath 17 is incorporated in the solder repairing apparatus 11. A certain flux in gel state is stored in the flux bath 17. The flux has a high heat resistance, for example. Such a flux melts at 200 degrees Celsius or higher, for example. If the melting point of solder is set at 220 degrees Celsius approximately, for example, the flux is allowed to melt immediately before the solder melts. Here, the flux bath 17 and the stage supporting mechanism 16 are supported on a single movable member 18. The flux bath 17 and the movable stage 12 can alternately be set at a predetermined operating position in this manner.

A dividing plate 21 in a vertical attitude is opposed to the support surface 13 of the movable stage 12. An arm member 22 is employed to position the dividing plate 21. The arm member 22 is designed to extend in the horizontal direction in parallel with the support surface 13. The width of the arm member 22 is set at 1.5 mm approximately, for example. The width of the arm member 22 is measured in the horizontal direction perpendicular to the longitudinal direction of the arm member 22. A support shaft 23 is fixed to the tip end of the arm member 22. The support shaft 23 is designed to extend in the direction of gravity from the arm member 22. The dividing plate 21 is attached to the tip end or lower end of the support shaft 23. The support shaft 23 may be formed integral with the dividing plate 21, for example. The dividing plate 21 may be made of a metallic material such as steel, brass, or copper, for example. Here, a hard chromium plating film is formed on the surface of the metal material such as steel, brass or copper. Such a hard chromium plating film exhibits a sufficiently low solder wettability, for example. Here, "a sufficiently low wettability" means that wettability is low enough to prevent adhesion of a molten solder even when the dividing plate 21 is brought into contact with the molten solder.

The dividing plate 21 includes a plate body 24 and a blade 25. The blade 25 is connected to the lower end of the plate body 24. The lower end of the plate body 24 is defined within a horizontal plane. The thickness of the blade 25 is gradually reduced from the thickness of the plate body 24 as the position of the blade 25 gets closer to the lower end of the blade 25. The lower end of the blade 25 defines an edge extending along a straight line parallel to the lower end of the plate body 24. The maximum thickness of the plate body 24 is set at 0.5 mm approximately, for example.

A vertical movement mechanism 26 is connected to the arm member 22. The vertical movement mechanism 26 serves to realize the upward and downward movements of the arm member 22 in the vertical direction. The arm member 22 is thus positioned in the vertical direction. Here, a predetermined play is provided in the vertical direction between the vertical movement mechanism 26 and the arm member 22. Such a play allows the arm member 22 to stay at a predetermined position even during the operation of the vertical movement mechanism 26. In other words, the arm member 22 is allowed to move in the vertical direction within the play even when the vertical movement mechanism 26 stands still.

Figure 2:
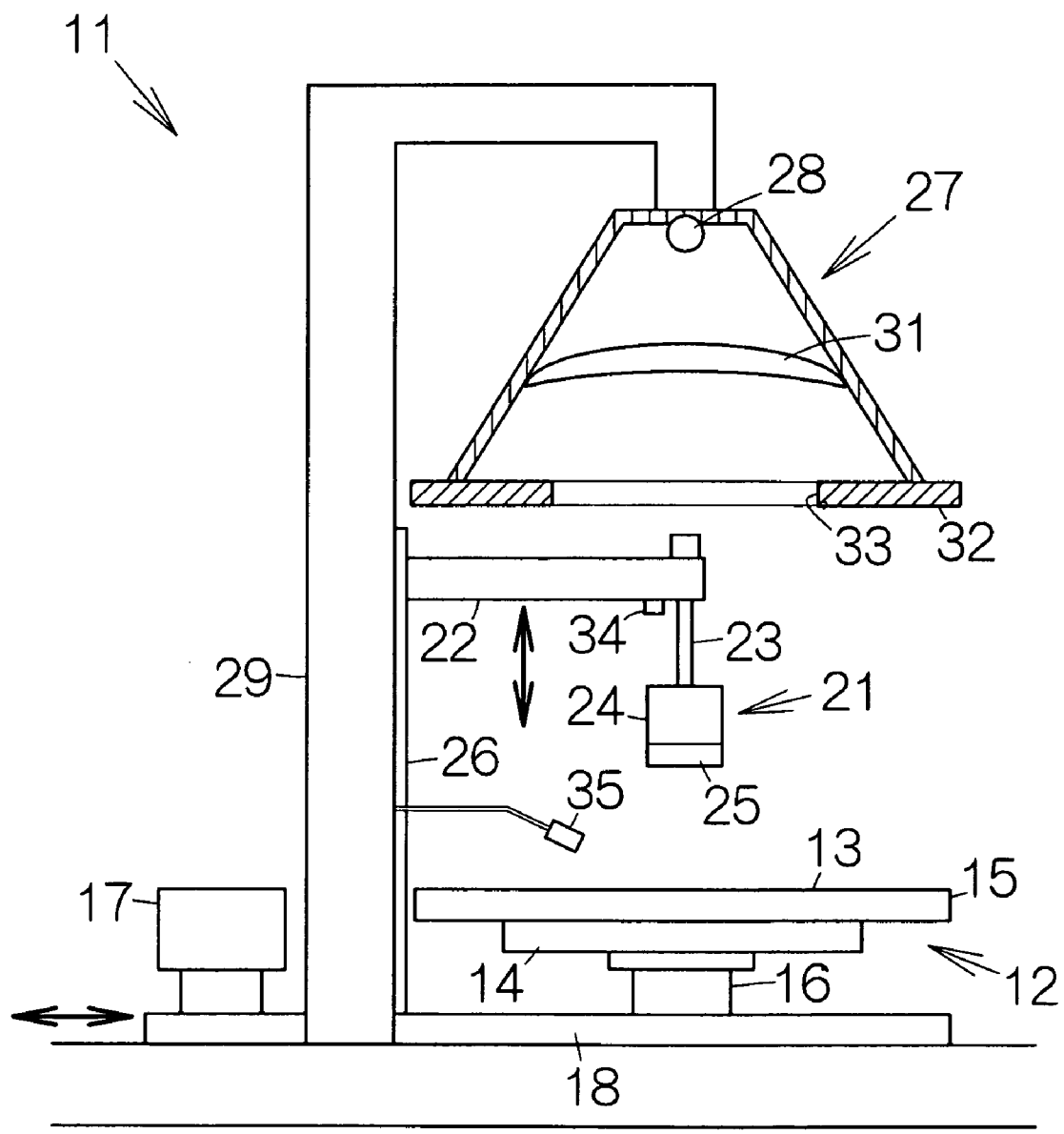
FIG. 2 is a front view, including a partial sectional view, schematically illustrating the solder repairing apparatus.

A heating unit 27 is placed at a position above the dividing plate 21. The heating unit 27 is opposed to the support surface 13 of the movable stage 12. The heating unit 27 includes a radiation source, namely a halogen lamp 28, as shown in FIG. 2. The halogen lamp 28 serves to radiate a certain energy beam, namely a heat beam, to the support surface 13 defined on the movable stage 12. The heating unit 27 may removably be fixed to a support pole 29, for example.

A collimator lens 31 is related to the halogen lamp 28. The collimator lens 31 serves to converge the heating beam radiated in a radial direction. Such a radial heating beam is converted into a parallel light. The support surface 13 on the movable stage 12 is in this manner allowed to receive the parallel light in the vertical direction perpendicular to the support surface 13.

A mask 32 is placed at a position between the collimator lens 31 and the support surface 13 of the movable stage 12. A window opening 33 is formed in the mask 32. The mask 32 serves to block the parallel light. The parallel light is allowed to pass through the window opening 33. A predetermined optical spot is in this manner formed on the support surface 13 based on the window opening 33. The window opening 33 may be formed in the shape of a circle, for example. It has been demonstrated that the temperature of 220-225 degrees Celsius is established at the optical spot on the support surface 13 within a circular spot having the radius of 5 mm from the center of the optical spot when the temperature of 235-240 degrees Celsius is established within a circular spot having the radius of 3 mm from the center of the optical spot. The masks 32 of different types may be prepared to provide the optical spot of different diameters, for example. The heating unit 27 may separately be prepared for each of the masks 32. In this case, the heating unit 27 may be exchanged depending on the desired diameter of the optical spot.

A camera 34 is incorporated in the solder repairing apparatus 11. The camera 34 is utilized to capture the two-dimensional image of the support surface 13. The optical axis of the camera 34 is set in the vertical direction perpendicular to the support surface 13. A monitor, not shown, is connected to the camera 34. The two-dimensional image of the support surface 13 is displayed on the monitor. The projection image of the dividing plate 21 is inserted into the two-dimensional image of the support surface 13 on the monitor. The operator can see the positional relationship between the support surface 13 and the dividing plate 21 on the screen of the monitor.

A noncontact temperature sensor 35 may be incorporated in the solder repairing apparatus 11. An infrared thermometer may be employed as the noncontact temperature sensor 35, for example. The noncontact temperature sensor 35 may be supported on the support pole 29, for example. The noncontact temperature sensor 35 is utilized to measure the temperature within the aforementioned optical spot.

Figure 3:
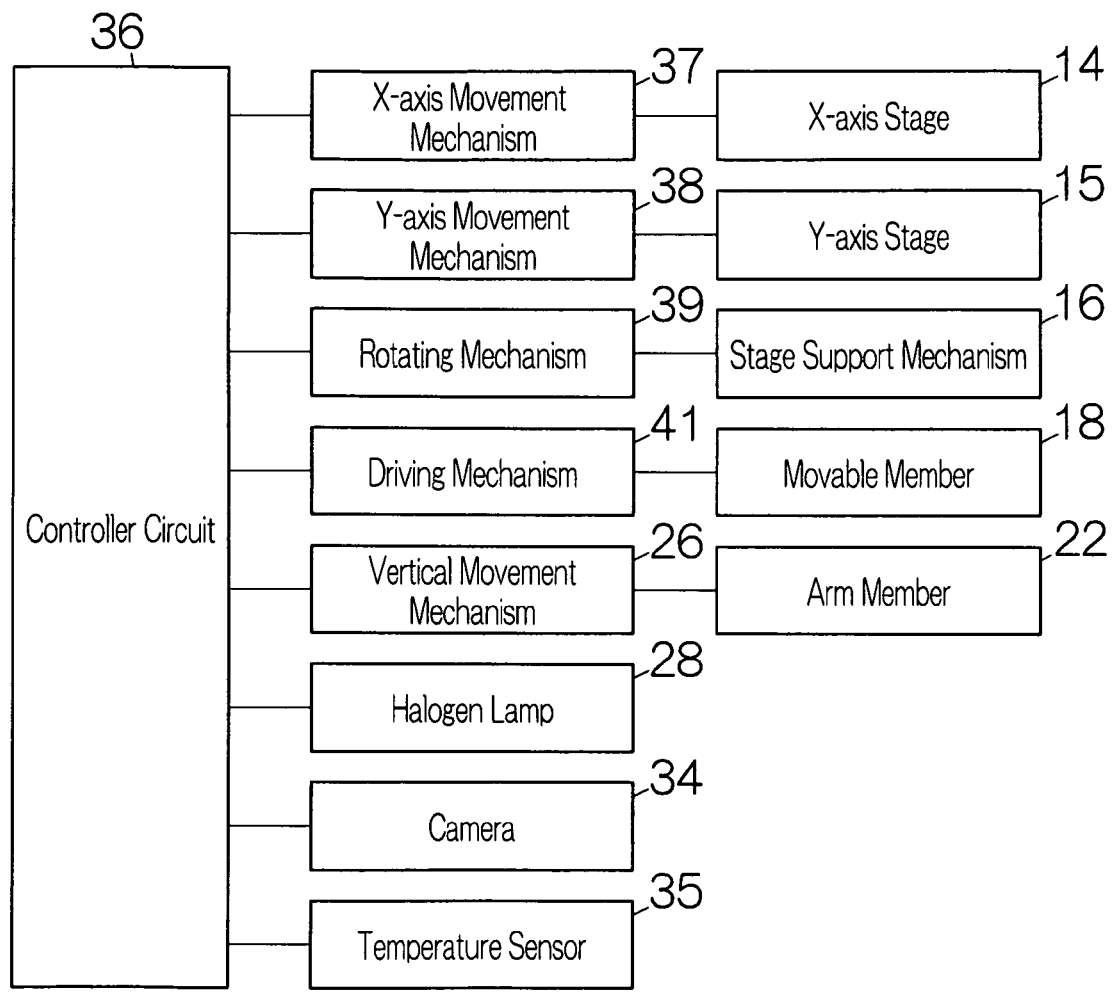
FIG. 3 is a block diagram schematically illustrating the control system of the solder repairing apparatus.

As shown in FIG. 3, a controller circuit 36 is incorporated in the solder repairing apparatus 11. The controller circuit 36 is connected to an x-axis movement mechanism 37 assigned to the X-axis stage 14, a y-axis movement mechanism 38 assigned to the Y-axis stage 15, a rotating mechanism 39 assigned to the stage supporting mechanism 16, a driving mechanism 41 assigned to the movable member 18, the vertical movement mechanism 26 assigned to the arm member 22, the halogen lamp 28, the camera 34, and the noncontact temperature sensor 35. The controller circuit 36 supplies predetermined control signals to the x-axis movement mechanism 37 for the X-axis stage 14 and the y-axis movement mechanism 38 for the Y-axis stage 15, respectively. An object on the movable stage 12 is thus positioned at a specific spot on the stage supporting mechanism 16. The two-dimensional image of the support surface 13 may be supplied to the controller circuit 36 from the camera 34 for positioning the object. The controller circuit 36 supplies a predetermined control signal to the rotating mechanism 39 for the stage supporting mechanism 16. A predetermined rotation angle is thus established around the vertical axis between the object on the movable stage 12 and the dividing plate 21. The controller circuit 36 supplies a predetermined control signal to the driving mechanism 41 for the movable member 18. The dividing plate 21 is thus opposed to one of the movable stage 12 and the flux bath 17. The controller circuit 36 supplies a predetermined control signal to the vertical movement mechanism 26 for the arm member 22. The dividing plate 21 thus gets closer to or farther from the support surface 13 in the vertical direction. The controller circuit 36 also operates to control the switch on/off of the halogen lamp 28 and the operation of the camera 34. The controller circuit 36 is designed to execute predetermined processing in response to a temperature detection signal supplied from the noncontact temperature sensor 35. The temperature within the specific spot is specified in the temperature detection signal.

Figure 4:
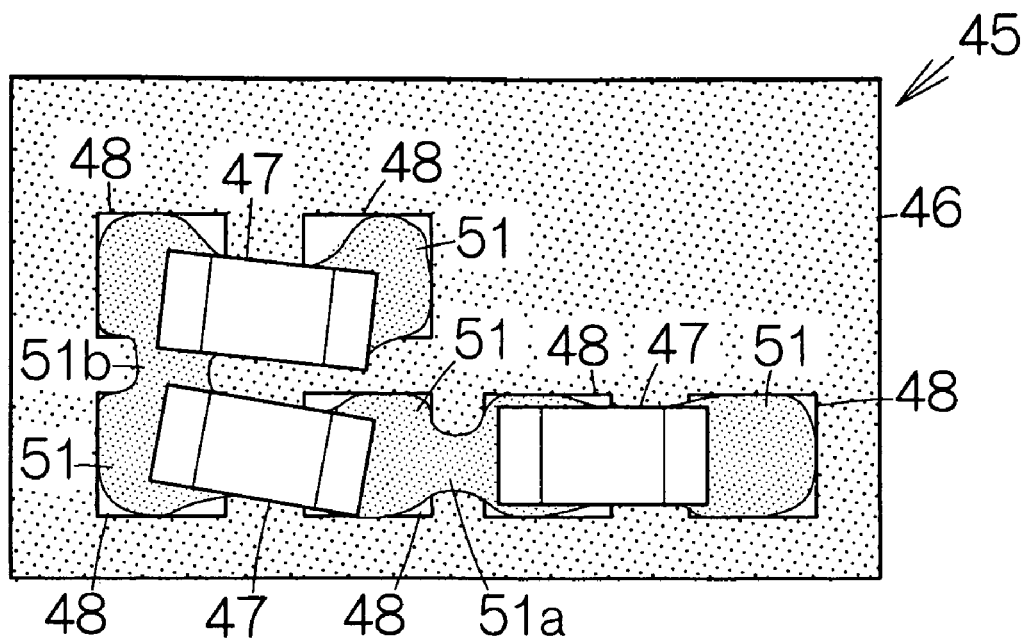
FIG. 4 is an enlarged partial plan view schematically illustrating solder on a printed wiring board.

Now, assume that a printed circuit board unit 45 is set on the support surface 13 of the movable stage 12. As shown in FIG. 4, two or more components 47 have been mounted on a printed wiring board 46 of the printed circuit board unit 45. The components 47 can be chip capacitors, chip resistances, and other chip-like electronic components, of 1005, 0603 or 0402 chip size, and terminals of flat cables. A pair of electrode pads 48 is formed on the surface of the printed wiring board 46 for each of the components 47. The component 47 is mounted on the corresponding pair of electrode pads 48. Solder 51 is utilized to mount the components 47 on the printed wiring board 46. Here, solder 51a, 51b bridge the adjacent ones of the electrode pads 48.

The dividing plate 21 is opposed to the flux bath 17, in place of the movable stage 12, prior to the setting of the printed circuit board unit 45. In this case, the controller circuit 36 supplies a control signal to the driving mechanism 41 for the movable member 18. The movable stage 12 is forced to move out of the space below the dividing plate 21. The operator is allowed to set the printed circuit board unit 45 on the support surface 45 without hindrance from the dividing plate 21. The controller circuit 36 then operates to instruct the application of flux. The controller circuit 36 supplies a control signal to the vertical movement mechanism 26. The vertical movement mechanism 26 makes the arm member 22 move in the direction of gravity. The tip end of the dividing plate 21 is immersed into the flux in the flux bath 17. The flux is in this manner applied to the dividing plate 21. The arm member 22 is moved upward in accordance with the instructions of the controller circuit 36. The controller circuit 36 then supplies a control signal to the driving mechanism 41. The movable stage 12 is thus opposed to the dividing plate 21.

Figure 5:
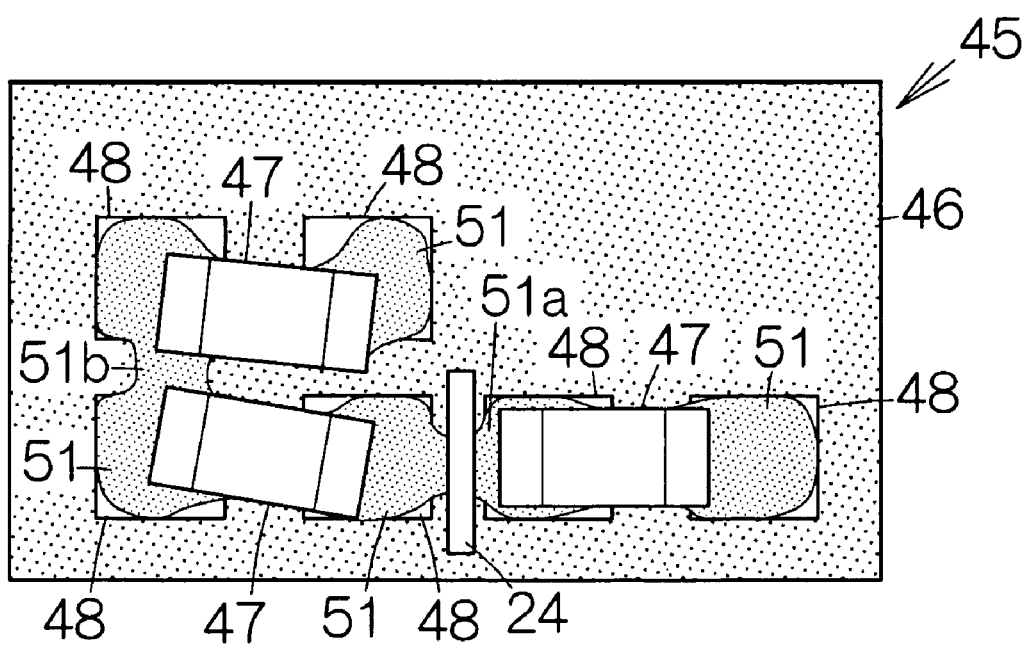
FIG. 5 is a view schematically illustrating a two-dimensional image captured at a camera.

An image signal is supplied to the controller circuit 36 from the camera 34. The controller circuit 36 operates to generate the two-dimensional image of the support surface 13 based on the image signal. As shown in FIG. 5, the projection image of the dividing plate 21 is inserted into the two-dimensional image. The operator operates the solder repairing apparatus 11 to move the movable stage 12 in view of the aforementioned two-dimensional image. The controller circuit 36 is designed to receive, from an input device, instructions to move the movable stage 12. The target solder 51a and the corresponding components 47 are in this manner positioned at the specific spot on the stage supporting mechanism 16. The specific spot is defined at a position right below the dividing plate 21. Alternatively, the controller circuit 36 may execute an image recognition processing instead of the aforementioned manual operation of the operator. In this case, the controller circuit 36 specifies the position of the dividing plate 12 on the two-dimensional image through the image recognition processing. Control signals are supplied to the x-axis movement mechanism 37 and the y-axis movement mechanism 38 based on the specified position of the dividing plate 21. The target solder 51a and the corresponding components 47 may be positioned at the specific spot on the stage supporting mechanism 16 in this manner.

Figure 6:
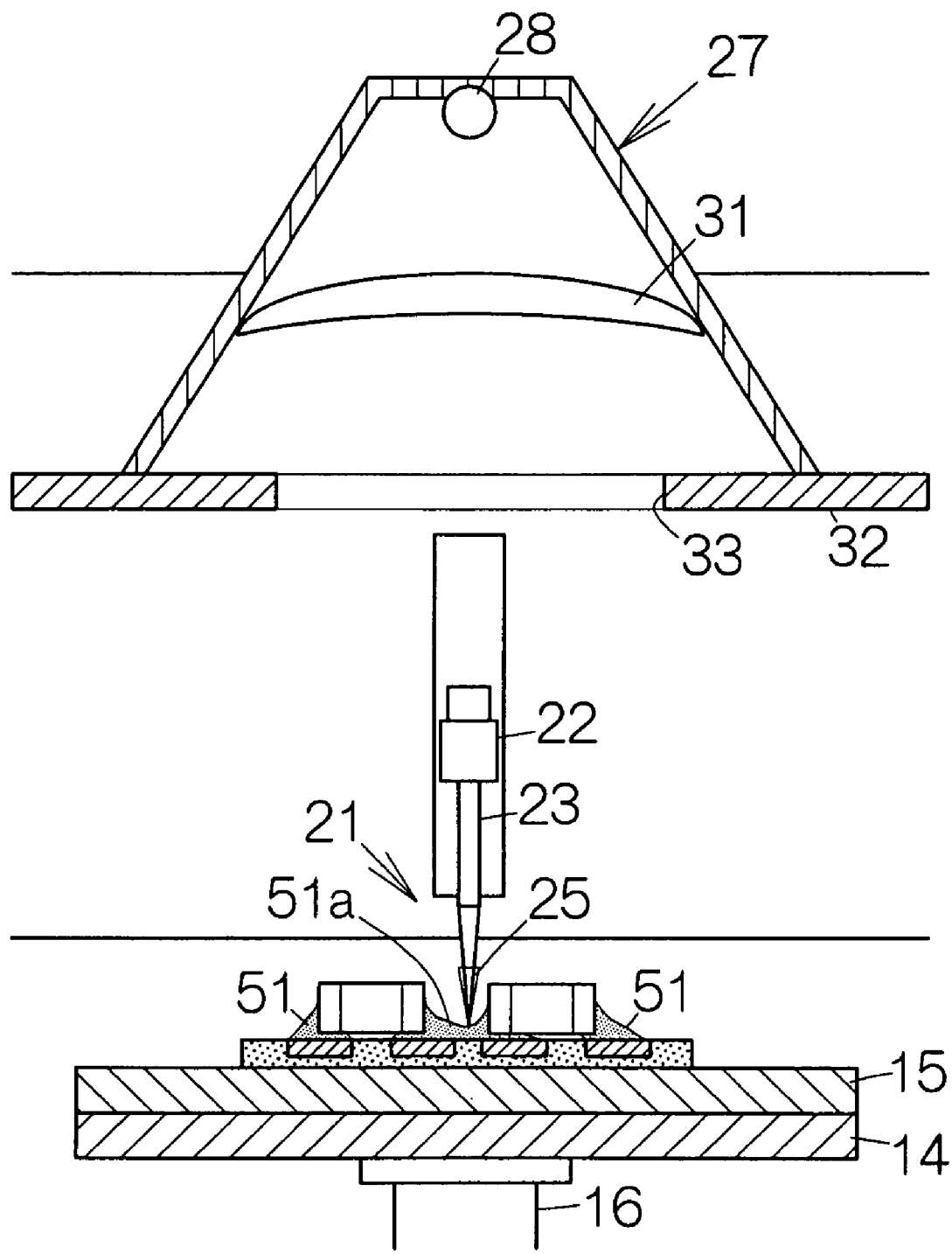
FIG. 6 is a partial sectional view of the solder repairing apparatus for schematically illustrating a dividing plate in contact with the solder.

The controller circuit 36 then executes a dividing process for the solder 51a. The controller circuit 36 first supplies a control signal to the vertical movement mechanism 26. The dividing plate 21 is driven to move downward. As shown in FIG. 6, when the blade 25 is brought in contact with the target solder 51a within the specific spot, the vertical movement mechanism 26 makes the dividing plate 21 stop moving downward. In this case, the vertical movement mechanism 26 makes the arm member 22 keep moving downward within the predetermined play. The target solder 51a serves to support the dividing plate 21 to position the dividing plate 21 at the upper limit of the play. An urging force is applied to the blade 25 against the solder 51a based on the weight of the dividing plate 21, the support shaft 23 and the arm member 22.

Figure 7:
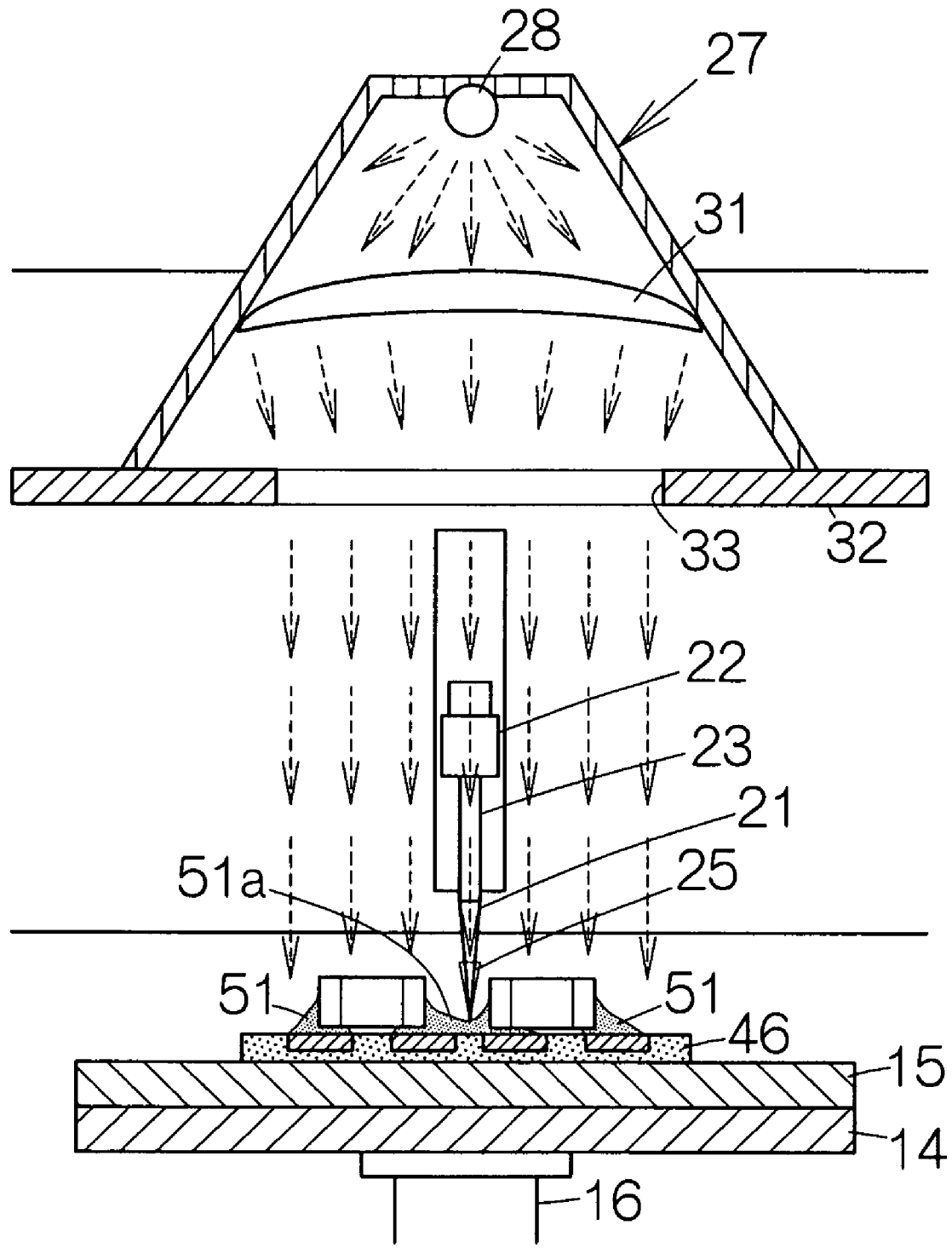
FIG. 7 is a partial sectional view of the solder repairing apparatus for schematically illustrating the operation of a heating unit.

The controller circuit 36 supplies a control signal to the halogen lamp 28. As shown in FIG. 7, the halogen lamp 28 starts radiating a heat beam. The optical spot in the shape of a circle is formed in the specific spot on the support surface 13. Even though the arm member 22 and the dividing plate 21 exist on the path of the heat beam, the entire spot within the circle having the radius of 3 mm from the center is allowed to enjoy a sufficient rise in the temperature. The temperature in this manner rises at the specific spot. In addition, the heat beam reaches the surface of the printed wiring board 46 in the vertical direction. The density of the thermal energy is maximized at the optical spot. The specific spot is thus efficiently heated.

Figure 8:
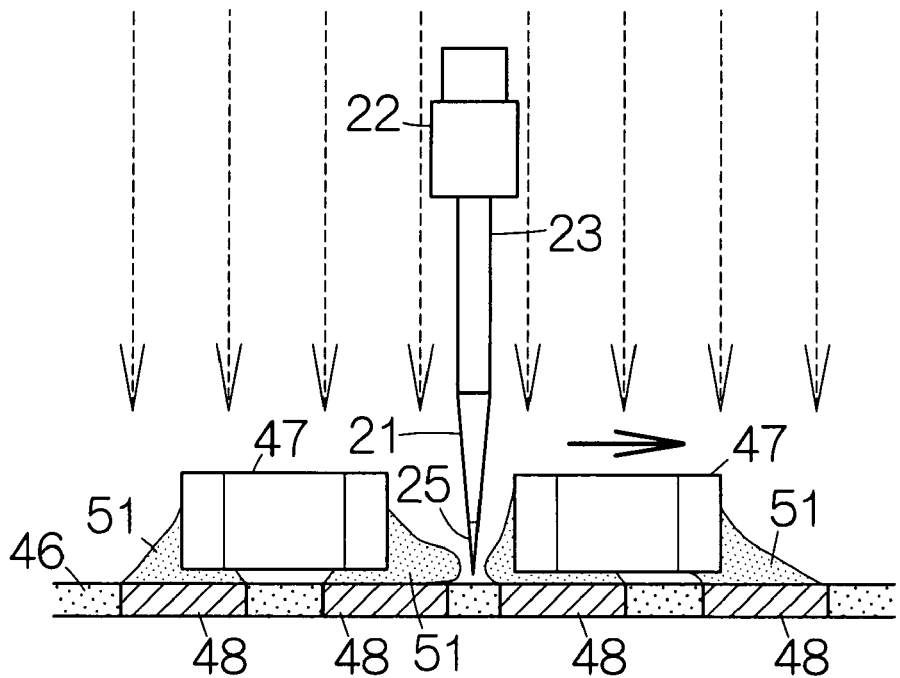
FIG. 8 is a side view of a printed circuit board unit for schematically illustrating the divided solder.

When the temperature of the specific spot reaches the melting point of the solder 51, 51a, the solder 51, 51a melts. When the solder 51a melts, the gravity makes the dividing plate 21 fall down, as shown in FIG. 8. Since the dividing plate 21 exhibits a low wettability to the solder 51, 51a, the dividing plate 21 repels the molten solder 51a. The molten solder 51a is thus divided into two parts. A certain clearance is established between the blade 25 and the surface of the printed wiring board 46. The blade 25 is prevented from colliding against the printed wiring board 46 when the blade 25 falls. Specifically, the fall of the blade 25 is restrained at the lower limit of the play for prevention of contact or collision between the blade 25 and the printed wiring board 46.

Figure 9:
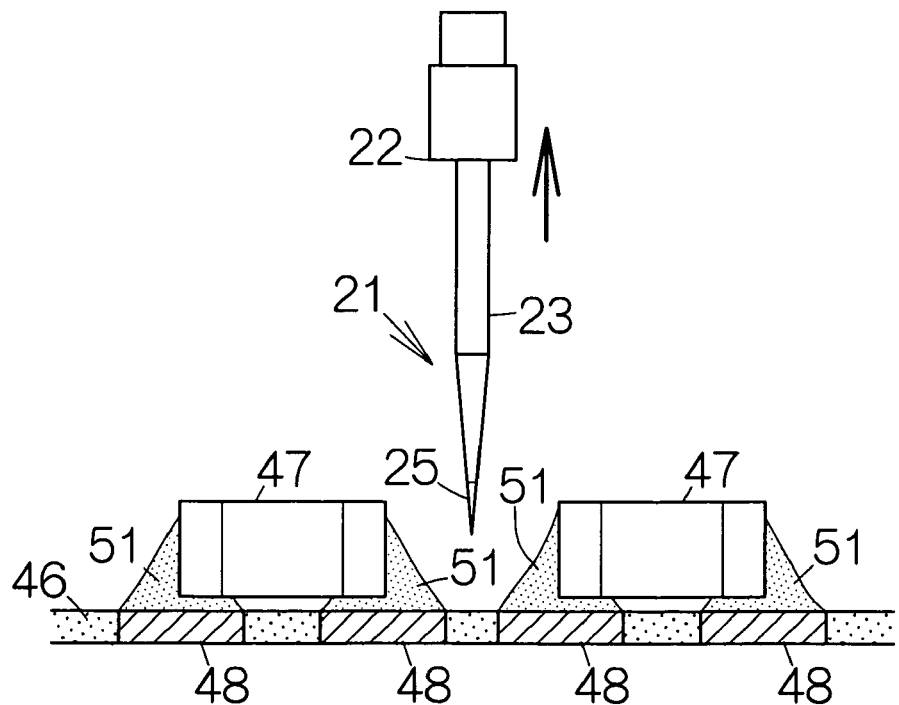
FIG. 9 is a side view of the printed circuit board unit for schematically illustrating the upward movement of the dividing plate.

When the molten solder 51a is divided into two parts, the divided parts of the molten solder 51a are forced to move toward the corresponding electrode pad 48 based on its own surface tension. The solder 51 on the two electrode pads 48 allows realization of the self alignment of the corresponding component 47. The component 47 is in this manner positioned at a designed position with high accuracy by simply dividing the solder 51a, as shown in FIG. 9.

The controller circuit 36 supplies a control signal to the halogen lamp 28 after the realization of the self alignment of the components 47. The halogen lamp 28 is controlled to stop radiation of the heat beam. The temperature of the specific spot starts dropping. When the temperature drops below the melting point of the solder 51, the solder 51 gets cured or hardened. Repair of the solder 51 is completed. The controller circuit 36 then supplies a control signal to the vertical movement mechanism 26. The vertical movement mechanism 26 forces the dividing plate 12 to move upward. Since the dividing plate 21 moves upward after the solder 51 has gotten cured or hardened, the solder 51 is reliably prevented from recombination between the divided parts. The aforementioned non-contact temperature sensor 35 may be utilized to measure the temperature at the specific spot for the upward movement of the dividing plate 21. In this case, the measured temperature serves to notify the completion of the solidification of the solder 51. Alternatively, the dividing plate 21 may be driven to move upward when a certain period elapses after the dividing plate 21 falls down. In this case, duration of time may be estimated beforehand between the time point when the halogen lamp 28 stops radiating the heat beam and the time point when the solder 51 gets cured or hardened.

Figure 10:
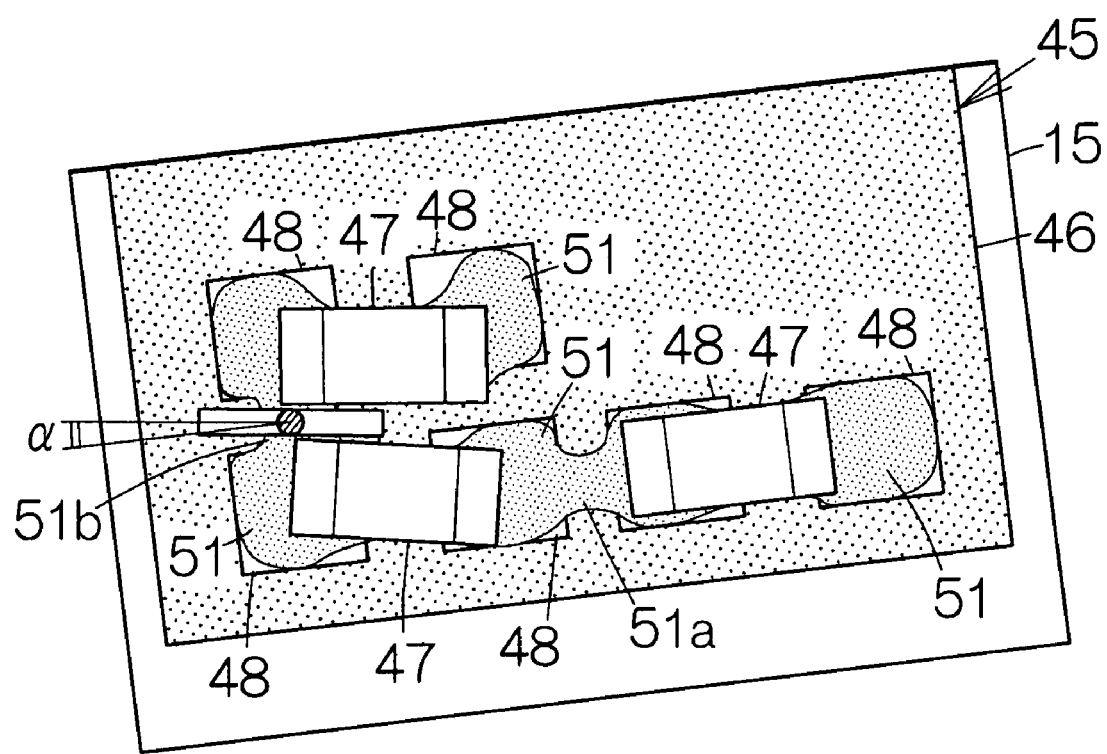
FIG. 10 is an enlarged partial plan view of the printed circuit board unit for schematically illustrating a predetermined rotation angle established between the printed wiring board and the dividing plate.

Now, assume that the components 47 are rotated around the vertical axes on the printed wiring board 46, as shown in FIG. 10, for example. When the components 47 have been positioned in the aforementioned manner, the controller circuit 36 supplies a predetermined control signal to the rotating mechanism 39 assigned to the stage supporting mechanism 16. The movable stage 12 is driven to rotate around the vertical axis. A predetermined rotation angle is in this manner established around the vertical axis between the printed circuit board unit 45 on the movable stage 12 and the dividing plate 21. The orientation of the dividing plate 21 is aligned with a gap between the components 47. The aforementioned dividing process is subsequently executed for the solder 51b. The solder 51b is divided into two parts. The molten solder 51 serves to realize the self alignment of the components 47. Even if the components 47 is rotated around the vertical axes on the printed wiring board 46, contact is in this manner prevented between the components 47 and the dividing plate 21.

Figure 11:
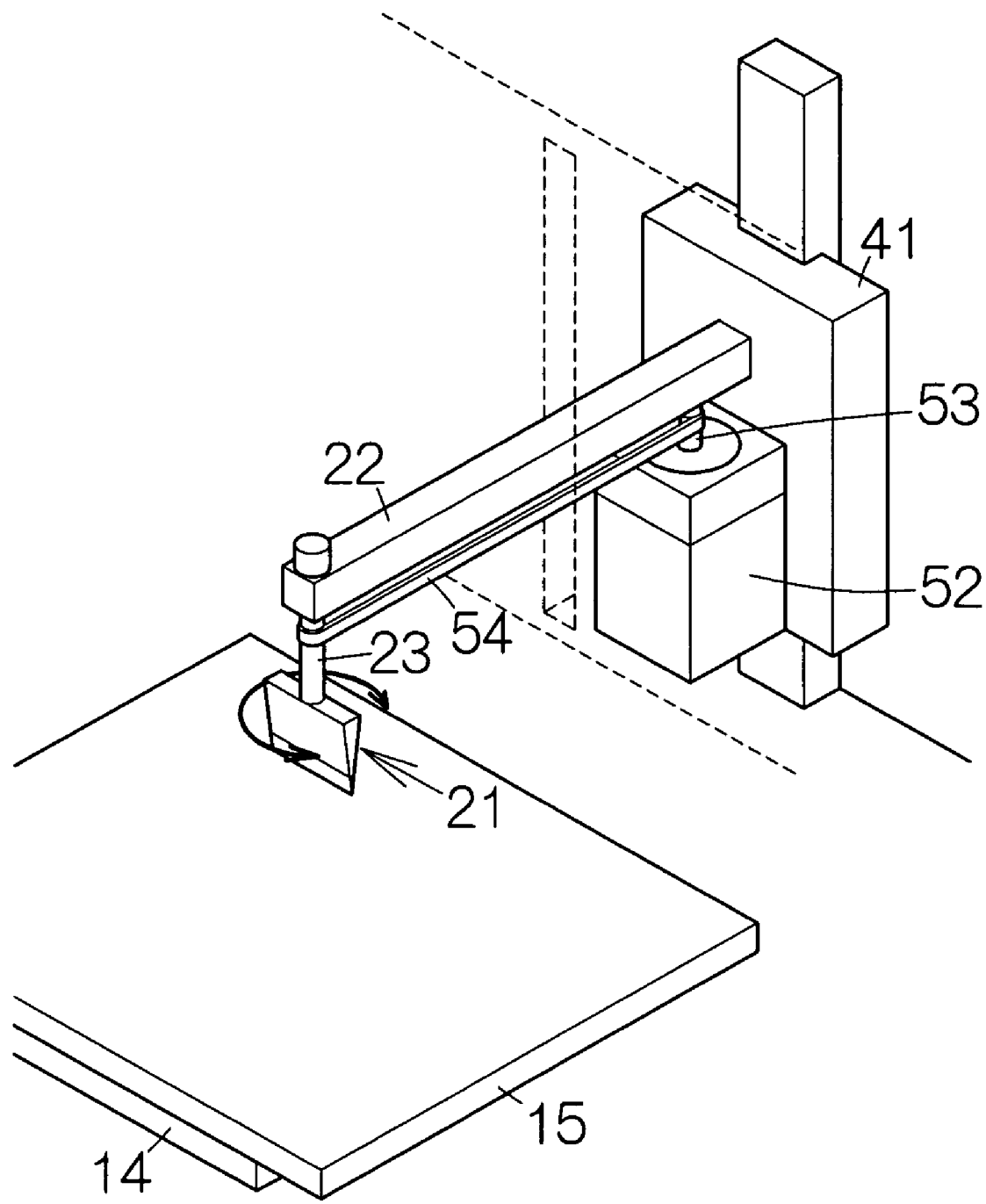
FIG. 11 is a perspective view schematically illustrating a pulse motor connected to the dividing plate.

Here, the dividing plate 21 may be driven to rotate around the vertical axis in place of the rotation of the movable stage 12. In this case, the arm member 22 may support the support shaft 23 for relative rotation around the vertical axis. A pulse motor 52 may be employed to drive the support shaft 23 around the vertical axis, for example. As shown in FIG. 11, a belt 54 may be employed to connect the support shaft 23 and a driving shaft 53 of the pulse motor 52, for example. A gear mechanism may be employed in place of the belt 54, for example.

What is claimed is:

1. A solder repairing apparatus comprising:
   a stage configured to place a surface of at least a specific part of an object along a reference plane within a specific spot defined on the stage;
   a heating unit applying a thermal energy to the specific spot defined on the stage;
   a dividing plate configured to move into the specific spot in a vertical attitude perpendicular to the reference plane, the dividing plate exhibiting a low solder wettability;
   an arm member connected to the dividing plate; and
   a vertical movement mechanism, wherein the vertical movement mechanism holds and moves the arm member vertically with a play, the play allowing the dividing plate and arm member to gravitate toward the object within the play based on the weight of the dividing plate while the vertical movement mechanism stands still.

2. The solder repairing apparatus according to claim 1, wherein the heating unit includes a radiation source radiating an energy beam.

3. The solder repairing apparatus according to claim 2, wherein the heating unit includes a mask placed between the radiation source and the specific spot, the mask defining a window opening so that the energy beam from the radiation source partly passes through the window opening.

4. The solder repairing apparatus according to claim 2, wherein the energy beam is radiated to the specific spot in a vertical direction perpendicular to the reference plane.

5. The solder repairing apparatus according to claim 1, further comprising a dividing plate supporting mechanism configured to support the dividing plate for relative rotation around a rotation axis perpendicular to the reference plane.

6. The solder repairing apparatus according to claim 1, further comprising a stage supporting mechanism configured to support the stage for relative rotation around a rotation axis perpendicular to the reference plane.

7. The solder repairing apparatus according to claim 1, further comprising a controller circuit outputting a control signal for starting application of the thermal energy after the dividing plate has contacted against the specific part with a predetermined urging force.

* * * * *